United States Patent
Iwamoto

(10) Patent No.: US 9,564,574 B2
(45) Date of Patent: Feb. 7, 2017

(54) PIEZOELECTRIC DEVICE AND METHOD FOR MANUFACTURING PIEZOELECTRIC DEVICE

(71) Applicant: Murata Manufacturing Co., Ltd., Nagaokakyo-shi, Kyoto-fu (JP)

(72) Inventor: Takashi Iwamoto, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 317 days.

(21) Appl. No.: 14/254,083

(22) Filed: Apr. 16, 2014

(65) Prior Publication Data

US 2014/0227434 A1    Aug. 14, 2014

Related U.S. Application Data

(60) Division of application No. 14/023,761, filed on Sep. 11, 2013, now Pat. No. 8,736,141, which is a
(Continued)

(30) Foreign Application Priority Data

Mar. 14, 2011 (JP) ................................ 2011-055699

(51) Int. Cl.
*H03H 9/25* (2006.01)
*H01L 41/314* (2013.01)
(Continued)

(52) U.S. Cl.
CPC ........... *H01L 41/314* (2013.01); *H01L 41/053* (2013.01); *H01L 41/0815* (2013.01); *H01L 41/18* (2013.01);
(Continued)

(58) Field of Classification Search
CPC ............ H01L 41/22; H03H 3/08; G01N 28/22
(Continued)

(56) References Cited

U.S. PATENT DOCUMENTS 6,445,265 B1 * 9/2002 Wright .......................... 333/193
8,736,141 B2 * 5/2014 Iwamoto ..................... 310/313 R
(Continued)

FOREIGN PATENT DOCUMENTS

JP    2002-534886 A    10/2002
JP    2006-513649 A     4/2006
(Continued)

OTHER PUBLICATIONS

Official Communication issued in corresponding European Patent Application No. 12756931.7, mailed on Aug. 1, 2014.
(Continued)

*Primary Examiner* — Thomas Dougherty
(74) *Attorney, Agent, or Firm* — Keating & Bennett, LLP

(57) ABSTRACT

In a method for manufacturing a piezoelectric device, a silicon oxide film is deposited by sputtering on a surface of a single-crystal piezoelectric substrate closer to an ion-implanted region, and a silicon nitride film is deposited by sputtering on a surface of the dielectric film opposite to a side thereof closer to the single-crystal piezoelectric substrate. The silicon oxide film has a composition that is deficient in oxygen relative to the stoichiometric composition. Accordingly, little oxygen is supplied from the silicon oxide film to the piezoelectric thin film during heat treatment of a piezoelectric device. This prevents oxidation of the piezoelectric thin film and therefore formation of an oxide layer with high resistivity in the piezoelectric thin film. As a result, a pyroelectric charge generated in the piezoelectric thin film can flow to the silicon oxide film.

9 Claims, 8 Drawing Sheets

Related U.S. Application Data continuation of application No. PCT/JP2012/056250, filed on Mar. 12, 2012.

(51) Int. Cl.

| | | |
|---|---|---|
| *H01L 41/053* | (2006.01) | |
| *H01L 41/18* | (2006.01) | |
| *H01L 41/27* | (2013.01) | |
| *H01L 41/08* | (2006.01) | |
| *H03H 3/02* | (2006.01) | |
| *H03H 3/08* | (2006.01) | |
| *H03H 9/02* | (2006.01) | |
| *H01L 41/313* | (2013.01) | |

(52) U.S. Cl.
CPC ............ *H01L 41/27* (2013.01); *H01L 41/313* (2013.01); *H03H 3/02* (2013.01); *H03H 3/08* (2013.01); *H03H 9/02921* (2013.01); *H03H 9/25* (2013.01)

(58) Field of Classification Search
USPC .. 310/313 A, 313 R; 29/25.35; 333/193, 194
See application file for complete search history.

(56) References Cited

U.S. PATENT DOCUMENTS

| | | |
|---|---|---|
| 2004/0036381 A1 | 2/2004 | Abbott et al. |
| 2004/0232804 A1 | 11/2004 | Kita |
| 2006/0043823 A1 | 3/2006 | Obara et al. |
| 2006/0076852 A1 | 4/2006 | Ruile et al. |
| 2006/0103486 A1* | 5/2006 | Ruile et al. ............ 333/133 |
| 2007/0296306 A1* | 12/2007 | Hauser et al. ............ 310/313 R |
| 2008/0179278 A1* | 7/2008 | Obara et al. ............ 216/13 |
| 2009/0072659 A1* | 3/2009 | Nishiyama ......... H03H 9/02559 310/313 B |
| 2009/0108961 A1 | 4/2009 | Roesler et al. |
| 2010/0225201 A1 | 9/2010 | Roesler et al. |
| 2012/0098387 A1 | 4/2012 | Iwamoto et al. |
| 2014/0139075 A1* | 5/2014 | Iwamoto ............... 310/364 |

FOREIGN PATENT DOCUMENTS

| | | |
|---|---|---|
| JP | 2006-297456 A | 11/2006 |
| JP | 2006-526919 A | 11/2006 |
| JP | 2010-16481 A | 1/2010 |
| WO | 2004/006431 A1 | 1/2004 |
| WO | 2005/050836 A1 | 6/2005 |
| WO | 2011/004665 A1 | 1/2011 |

OTHER PUBLICATIONS

Bordui et al., "Chemically Reduced Lithium Niobate Single Crystals: Processing, Properties and Improved Surface Acoustic Wave Device Fabrication and Performance", Journal of Applied Physics, American Institute of Physics, vol. 85, No. 7, Apr. 1, 1999, pp. 3766-3769.

Solal et al., "Oriented Lithium Niobate Layers Transferred on 4" (100) Silicon Wafer for RF SAW Devices", 2002, IEEE Ultrasonics Symposium, Jan. 1, 2002, pp. 131-134.

Da Silva Zambom et al., "Non-Stoichiometric Silicon Oxide Deposited at Low Gaseous N2O/SiH4 Ratios", Thin Solid Films, vol. 459, Nos. 1-2, Jul. 1, 2004, pp. 220-223.

Iwamoto, "Piezoelectric Device and Method for Manufacturing Piezoelectric Device", U.S. Appl. No. 14/023,761, filed Sep. 11, 2013.

Official Communication issued in corresponding Japanese Patent Application No. 2013-504716, mailed on Dec. 24, 2014.

Official Communication issued in corresponding Japanese Patent Application No. 2013-504716, mailed on Jul. 21, 2015.

* cited by examiner

PIEZOELECTRIC DEVICE AND METHOD FOR MANUFACTURING PIEZOELECTRIC DEVICE

BACKGROUND OF THE INVENTION

1. Field of the Invention

The present invention relates to piezoelectric devices including a piezoelectric thin film and methods for manufacturing such piezoelectric devices.

2. Description of the Related Art

Piezoelectric devices including a piezoelectric thin film are currently being developed. An example of such a piezoelectric device is a surface acoustic wave device disclosed in Japanese Unexamined Patent Application Publication No. 6-326553.

FIG. 1A is an external perspective view of the surface acoustic wave device in Japanese Unexamined Patent Application Publication No. 6-326553. FIG. 1B is a sectional view taken along line A-A' in FIG. 1A. The surface acoustic wave device shown in FIGS. 1A and 1B includes a non-piezoelectric substrate 150, an inorganic thin film 140 formed on the surface of the non-piezoelectric substrate 150, a piezoelectric thin plate 120 formed on the surface of the inorganic thin film 140, and comb-shaped electrodes 130 and 130' formed on the surface of the piezoelectric thin plate 120. The inorganic thin film 140 is formed of, for example, a silicon oxide film. The piezoelectric thin plate 120 is formed of, for example, lithium niobate or lithium tantalate.

The piezoelectric thin plate 120, which is formed of lithium niobate or lithium tantalate, has pyroelectricity and high insulation properties. This causes a problem in that, when a piezoelectric device is manufactured using the piezoelectric thin plate 120 formed of such a material, a build-up of pyroelectric charge generated in the piezoelectric thin plate 120 damages the comb-shaped electrodes 130 and 130' formed on the piezoelectric thin plate 120.

Accordingly, in the related art, a technique is used in which reduction treatment is performed on the piezoelectric thin plate 120 to decrease the insulation properties of the piezoelectric thin plate 120 so that a pyroelectric charge generated in the piezoelectric thin plate 120 flows from the piezoelectric thin plate 120 to the non-piezoelectric substrate 150.

However, in the piezoelectric device having the inorganic thin film 140 (oxide film), which is formed of a silicon oxide film, between the non-piezoelectric substrate 150 and the piezoelectric thin plate 120, which is extremely thin with a predetermined thickness (for example, 1 μm) or less, oxygen is supplied from the inorganic thin film 140 to the piezoelectric thin plate 120. For example, when the piezoelectric device is mounted on a module board, heat treatment is performed at 230° C. or higher. Even if the heat treatment is performed in a reflow oven in a reducing atmosphere, oxygen is supplied from the inorganic thin film 140 to the piezoelectric thin plate 120. This oxidizes a group of 5 to 100 atoms in the piezoelectric thin plate 120 that are adjacent to the oxide film and therefore removes the reduced state of the piezoelectric thin plate, thus forming an oxide layer 121 with high resistivity in the piezoelectric thin plate 120. As a result, as shown in FIG. 2, the oxide layer 121 prevents a pyroelectric charge generated in the piezoelectric thin plate 120 from flowing to the non-piezoelectric substrate 150, thus leaving a build-up of pyroelectric charge in the piezoelectric thin plate 120.

Thus, the piezoelectric device having the oxide film between the extremely thin piezoelectric thin plate 120 and the non-piezoelectric substrate 150 has a problem in that a build-up of pyroelectric charge in the piezoelectric thin plate 120 damages the comb-shaped electrodes 130 and 130' formed on the piezoelectric thin plate 120. In particular, the oxidation of the piezoelectric by the oxide film has a greater impact on a device including an extremely thin piezoelectric than a conventional device including a piezoelectric substrate.

SUMMARY OF THE INVENTION

Accordingly, preferred embodiments of the present invention provide a piezoelectric device that prevents oxidation of an extremely thin piezoelectric thin film and prevents damage to electrodes located on the piezoelectric thin film caused by pyroelectric charge and also provide a method for manufacturing such a piezoelectric device.

A piezoelectric device according to a preferred embodiment of the present invention includes a support, an oxide film located on the support, and a piezoelectric thin film located on a surface of the oxide film opposite to a surface thereof closer to the support. The oxide film has a composition containing less oxygen than a stoichiometric composition.

The piezoelectric device includes the oxide film between a support substrate and the piezoelectric thin film, which is extremely thin, for example, about 1 μm or less thick. The oxide film in the piezoelectric device, however, has a composition that is deficient in oxygen relative to the stoichiometric composition. Accordingly, little oxygen is supplied from the oxide film to the piezoelectric thin film during heat treatment of the piezoelectric device, for example, when the piezoelectric device is mounted on a module board. This prevents oxidation of the piezoelectric thin film and therefore formation of an oxide layer with high resistivity in the piezoelectric thin film. As a result, a pyroelectric charge generated in the piezoelectric thin film flows to the oxide film.

Thus, the piezoelectric device prevents oxidation of the extremely thin piezoelectric thin film and prevents damage to electrodes located on the piezoelectric thin film caused by pyroelectric charge.

The oxide film preferably is a silicon oxide film, and the composition of the oxide film preferably satisfies the relationship $1.6 \leq y/x < 2$ in $Si_xO_y$, for example.

Such a composition prevents oxidation of the piezoelectric thin film and also allows the resistivity of the oxide film itself to be set to a level that does not adversely affect the characteristics of the piezoelectric device.

The piezoelectric thin film preferably includes single-crystal lithium niobate or single-crystal lithium tantalite, for example.

A piezoelectric thin film including single-crystal lithium niobate or single-crystal lithium tantalate has pyroelectricity and high insulation properties. Thus, the piezoelectric device according to a preferred embodiment of the present invention is suitable when a piezoelectric thin film made of such a material is used.

An example of a method for manufacturing a piezoelectric device according to another preferred embodiment of the present invention includes the following steps.

The method for manufacturing a piezoelectric device includes at least an oxide-film forming step and a piezoelectric-thin-film forming step. The oxide-film forming step involves forming an oxide film having a composition containing less oxygen than a stoichiometric composition on a support. The piezoelectric-thin-film forming step involves forming a piezoelectric thin film on a surface of the oxide film opposite to a surface thereof closer to the support.

The piezoelectric device manufactured by this method includes the oxide film between a support substrate and the piezoelectric thin film, which is extremely thin, for example, about 1 μm or less thick. This method of manufacture, however, forms an oxide film having a composition that is deficient in oxygen relative to the stoichiometric composition. Accordingly, little oxygen is supplied from the oxide film to the piezoelectric thin film during heat treatment of the piezoelectric device, for example, when the piezoelectric device is mounted on a module board. This prevents oxidation of the piezoelectric thin film and therefore formation of an oxide layer with high resistivity in the piezoelectric thin film. As a result, a pyroelectric charge generated in the piezoelectric thin film flows to the oxide film.

Thus, this method for manufacturing a piezoelectric device provides a piezoelectric device that prevents oxidation of an extremely thin piezoelectric thin film and prevents damage to electrodes located on the piezoelectric thin film caused by pyroelectric charge.

The piezoelectric-thin-film forming step preferably includes at least an ion implantation step and a splitting step. The ion implantation step involves implanting an ionized element into a piezoelectric substrate to form a region in which the concentration of the element implanted into the piezoelectric substrate peaks. The splitting step involves splitting the piezoelectric substrate along the region in which the concentration of the implanted element peaks to form the piezoelectric thin film on the oxide film.

A piezoelectric device including a piezoelectric thin film formed by an ion implantation step particularly easily absorbs oxygen because strain remains in the crystal lattice after ion implantation. Thus, the method for manufacturing a piezoelectric device according to a preferred embodiment of the present invention is suitable when a piezoelectric thin film is formed by an ion implantation step.

The oxide film preferably is a silicon oxide film, and the composition of the oxide film preferably satisfies the relationship $1.6 \leq y/x < 2$ in $Si_xO_y$, for example.

Such a composition prevents oxidation of the piezoelectric thin film and also allows the resistivity of the oxide film itself to be set to a level that does not adversely affect the characteristics of the piezoelectric device.

The piezoelectric thin film preferably is formed of single-crystal lithium niobate or single-crystal lithium tantalite, for example.

A piezoelectric thin film formed of single-crystal lithium niobate or single-crystal lithium tantalate has pyroelectricity and high insulation properties. Thus, the method for manufacturing a piezoelectric device according to a preferred embodiment of the present invention is suitable when a piezoelectric thin film is formed using such a material.

Various preferred embodiments of the present invention prevent damage to electrodes located on a piezoelectric thin film caused by pyroelectric charge.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

An example of a method for manufacturing a piezoelectric device according to a preferred embodiment of the present invention will now be described with reference to the drawings. As the method for manufacturing a piezoelectric device, a method for manufacturing a surface acoustic wave device will be described below by way of example.

Figure 3:
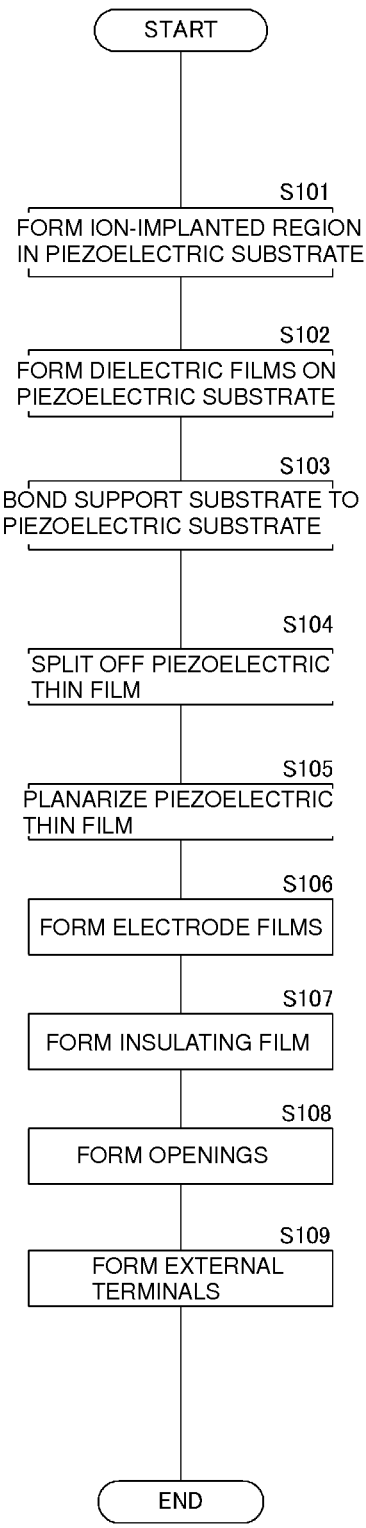
FIG. 3 is a flowchart showing a method for manufacturing a piezoelectric device according to a preferred embodiment of the present invention.

FIG. 3 is a flowchart showing the method for manufacturing a piezoelectric device according to a preferred embodiment of the present invention. FIGS. 4 to 7 are sectional views schematically showing a process for manufacturing a piezoelectric device according to the preferred embodiment of the present invention.

Figure 4A:
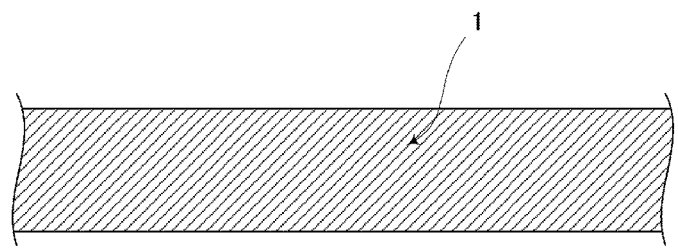
FIGS. 4A and 4B are sectional views schematically showing the process for manufacturing a piezoelectric device shown in FIG. 3.

Referring first to FIG. 4A, a single-crystal piezoelectric substrate 1 having a predetermined thickness is provided. Also provided is a support substrate 50 having a predetermined thickness, as shown in FIG. 5B, described later. The single-crystal piezoelectric substrate 1 preferably is a lithium tantalate (LT) substrate, and the support substrate 50 is a glass substrate. The support substrate 50 is a substrate on which a plurality of piezoelectric devices are to be arranged. Instead of a lithium tantalate substrate, the single-crystal piezoelectric substrate 1 may be a lithium niobate substrate, a lithium tetraborate substrate, a langasite substrate, or a potassium niobate substrate, for example. Instead of a glass substrate, the support substrate 50 may be, for example, a Si substrate, a quartz substrate, or a sapphire substrate, for example.

Figure 4B:
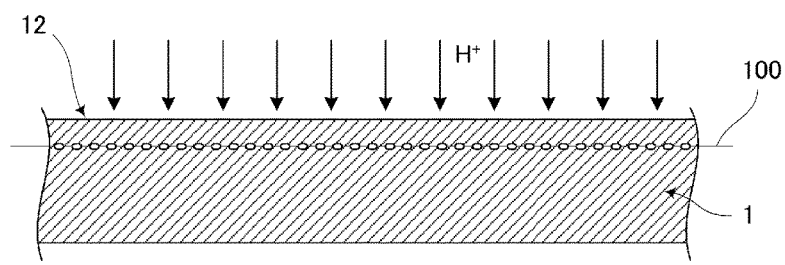

Referring now to FIG. 4B, hydrogen ions are implanted into a surface 12 of the single-crystal piezoelectric substrate 1 to form an ion-implanted region 100 in the single-crystal piezoelectric substrate 1 (S101 in FIG. 3). For example, if the single-crystal piezoelectric substrate 1 is a lithium tantalate substrate, hydrogen ions preferably are implanted at a dose of about $1.0 \times 10^{17}$ atoms/cm$^2$ with an acceleration energy of about 80 keV to form a hydrogen-distributed region at a depth of about 500 nm from the surface 12, thus forming the ion-implanted region 100, for example. The ion-implanted region 100 is a region in which the concentration of the ion element implanted into the single-crystal piezoelectric substrate 1 peaks.

If the single-crystal piezoelectric substrate 1 is a substrate other than a lithium tantalate substrate, ion implantation is performed under the conditions depending on the particular substrate.

Figure 5A:
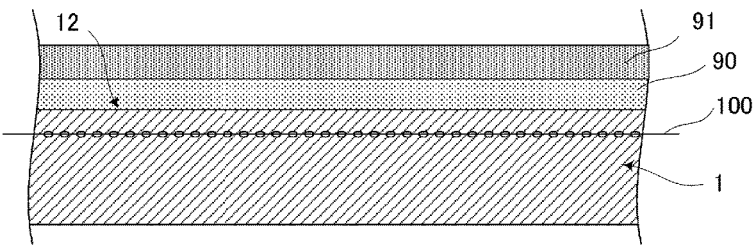
FIGS. 5A-5C are sectional views schematically showing the process for manufacturing a piezoelectric device shown in FIG. 3.
Figure 5B:
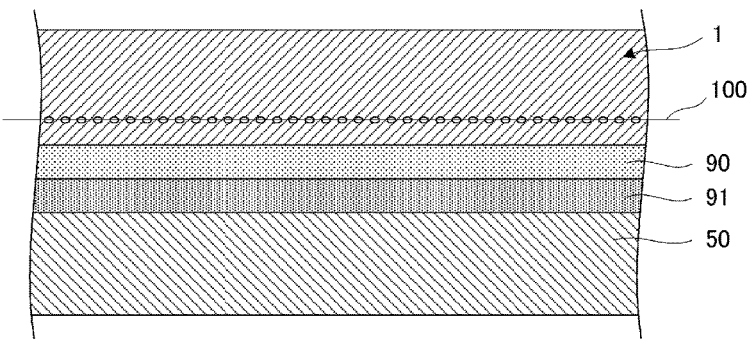

Referring now to FIG. 5A, dielectric films 90 and 91 are formed on the surface 12 of the single-crystal piezoelectric substrate 1 closer to the ion-implanted region 100 (S102 in FIG. 3). Specifically, in S102, a silicon oxide film 90 is preferably deposited to a thickness of about 700 nm on the surface 12 of the single-crystal piezoelectric substrate 1 closer to the ion-implanted region 100, and a silicon nitride film 91 is preferably deposited to a thickness of about 1,400 nm on the surface of the dielectric film 90 opposite to the side thereof closer to the single-crystal piezoelectric substrate 1. The silicon oxide film 90 and the silicon nitride film 91 are deposited by, for example, evaporation, sputtering, or CVD. The silicon oxide film 90 and the silicon nitride film 91 preferably are insulating films having resistivities of about $10^4$ Ω·cm or more, for example. As the temperature changes, the silicon oxide film 90 operates in the direction in which it cancels out the frequency shift of a piezoelectric thin film 10 formed of lithium tantalate.

The silicon oxide film 90 is energetically lowest and most stable when the ratio of silicon atoms to oxygen atoms is 1:2, which is the stoichiometric composition. In this preferred embodiment, however, the silicon oxide film 90 has a composition that is deficient in oxygen relative to the stoichiometric composition. Specifically, the silicon oxide film 90 preferably has a composition satisfying the relationship $1.6 \leq y/x < 2$ in $Si_xO_y$, for example, as described in detail later.

Referring now to FIG. 5B, the support substrate 50 is bonded to the single-crystal piezoelectric substrate 1 (S103 in FIG. 3). The support substrate 50 corresponds to a "support".

This bonding can be performed by direct bonding such as activation bonding or hydrophilic bonding or by bonding using interdiffusion through a metal layer, for example. Although the support substrate 50 preferably is bonded to the single-crystal piezoelectric substrate 1 in this preferred embodiment, the support substrate 50 may in practice be formed on the single-crystal piezoelectric substrate 1, for example, by deposition.

The single-crystal piezoelectric substrate 1 is then split along the ion-implanted region 100 by heating the stack of the single-crystal piezoelectric substrate 1 and the support substrate 50 shown in FIG. 5B (to 500° C. in this preferred embodiment) in a vacuum atmosphere (S104 in FIG. 3).

Figure 5C:
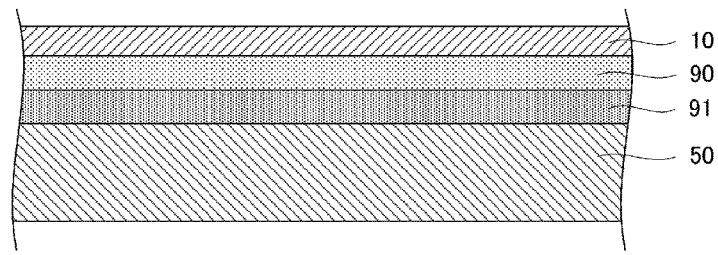

Referring now to FIG. 5C, a single-crystal piezoelectric thin film 10 preferably having a thickness of about 500 nm is formed on the support substrate 50 by the splitting step at S104. During heating in the splitting step at S104, no oxygen is supplied from the silicon oxide film 90 to the piezoelectric thin film 10 because the silicon oxide film 90 has a composition that is deficient in oxygen relative to the stoichiometric composition, which prevents oxidation of the piezoelectric thin film 10.

The surface of the split-off piezoelectric thin film 10 is then planarized by polishing such as CMP (S105 in FIG. 3). The piezoelectric thin film 10 preferably has a surface roughness of about 0.5 nm or less in terms of arithmetic mean roughness Ra, for example.

Figure 6A:
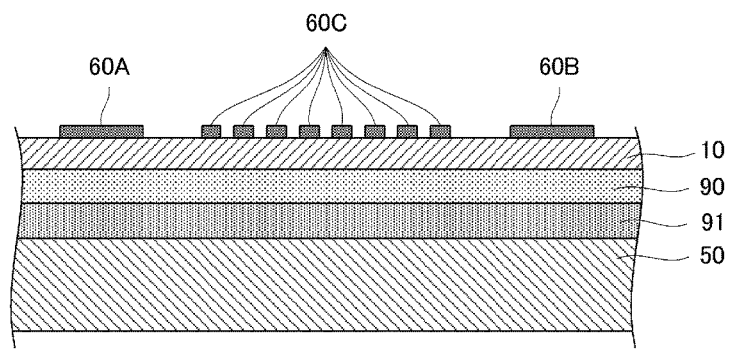
FIGS. 6A and 6B are sectional views schematically showing the process for manufacturing a piezoelectric device shown in FIG. 3.

Referring now to FIG. 6A, upper electrodes 60A and 60B and interdigital transducer (IDT) electrodes 60C having a predetermined thickness are formed on the surface of the piezoelectric thin film 10, for example, using aluminum (Al) (S106 in FIG. 3).

Instead of Al, the electrodes 60A to 60C may be formed using metals such as Al, W, Mo, Ta, Hf, Cu, Pt, Ti, and Au alone or in layers depending on the device specifications.

Figure 6B:
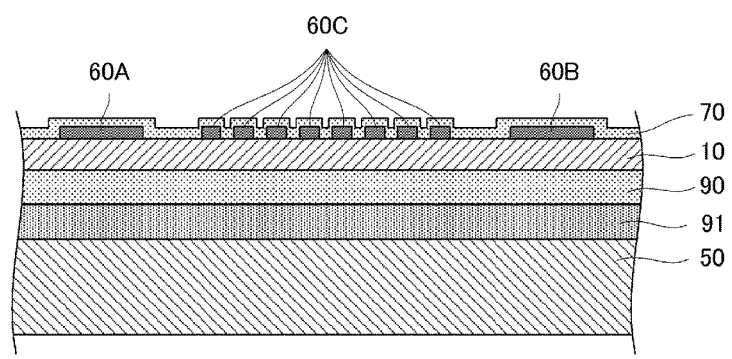

Referring now to FIG. 6B, an insulating film 70 is formed on the surfaces of the piezoelectric thin film 10 and the electrodes 60A to 60C to protect the piezoelectric thin film 10 and the electrodes 60A to 60C (S107 in FIG. 3).

Figure 7A:
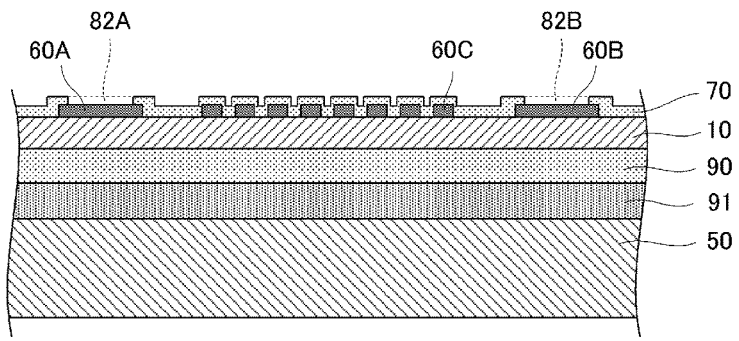
FIGS. 7A and 7B are sectional views schematically showing the process for manufacturing a piezoelectric device shown in FIG. 3.

Referring now to FIG. 7A, openings 82A and 82B are formed in the regions of the insulating film 70 where the upper electrodes 60A and 60B are to be exposed, for example, by etching (S108 in FIG. 3).

Figure 7B:
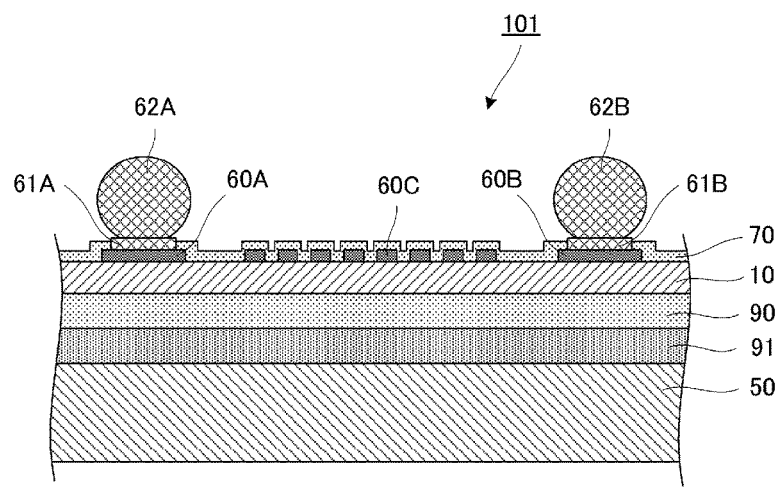

Referring now to FIG. 7B, external terminals are formed (S109 in FIG. 3). Specifically, bump pads 61A and 61B are formed on the upper electrodes 60A and 60B, respectively, and bumps 62A and 62B are formed on the bump pads 61A and 61B, respectively.

Finally, a separating step of separating a plurality of piezoelectric devices 101 formed on the support substrate 50 is performed, followed by packaging using a mold. In this manner, the piezoelectric devices 101 are formed. Thus, a plurality of piezoelectric devices 101 can be simultaneously manufactured. Because a plurality of piezoelectric devices 101 can be simultaneously manufactured in this preferred embodiment, the manufacturing costs of the piezoelectric devices 101 can be significantly reduced.

Figure 1A:
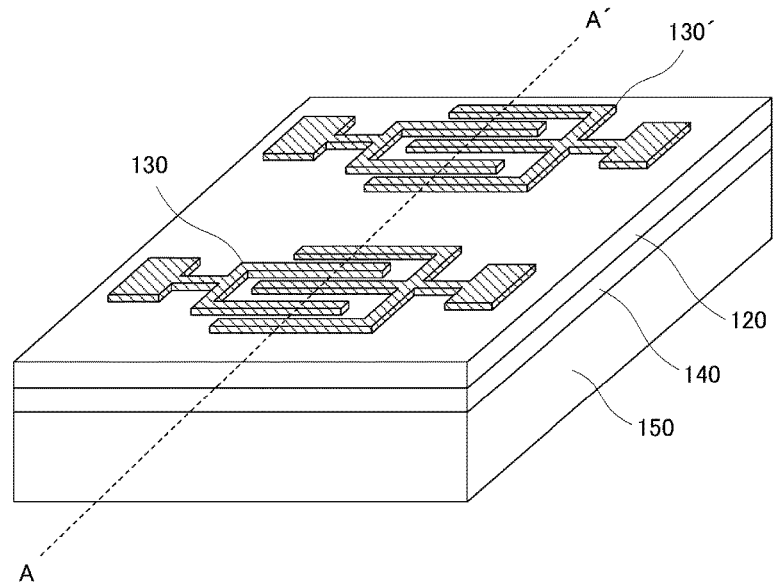
FIG. 1A is an external perspective view of a surface acoustic wave device in Japanese Unexamined Patent Application Publication No. 6-326553.
Figure 1B:
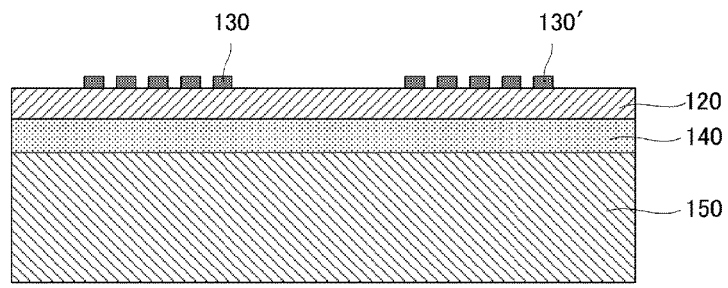
FIG. 1B is a sectional view taken along line A-A' in FIG. 1A.
Figure 2:
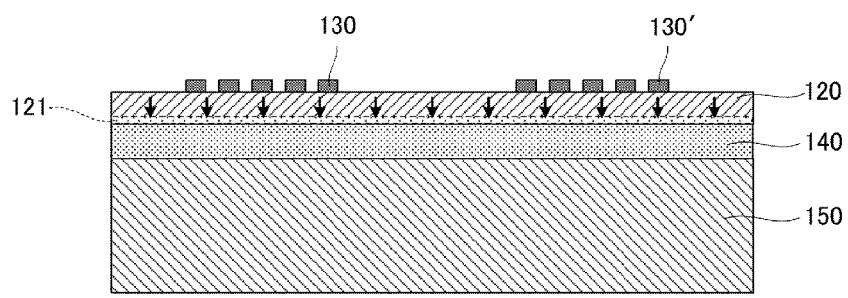
FIG. 2 is a sectional view, taken along line A-A' in FIG. 1A, schematically showing a flow of pyroelectric charge in the surface acoustic wave device in Japanese Unexamined Patent Application Publication No. 6-326553.
Figure 8:
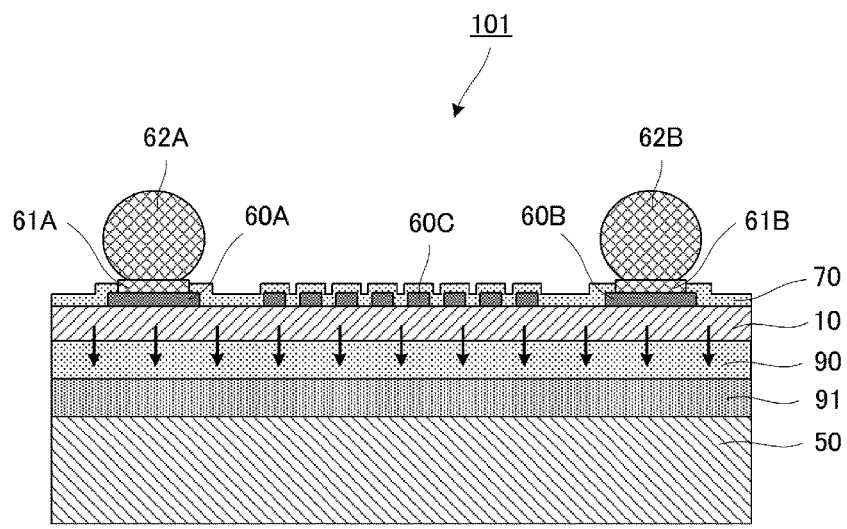
FIG. 8 is a sectional view schematically showing a flow of pyroelectric charge in the piezoelectric device according to a preferred embodiment of the present invention.

As shown in FIG. 7B, the piezoelectric device 101 manufactured by the above method of manufacture includes the silicon oxide film 90 between the support substrate 50 and the piezoelectric thin film 10, which is extremely thin, for example, about 1 μm or less thick. That is, the piezoelectric thin film 10 and the silicon oxide film are formed adjacent to each other. In this preferred embodiment, the silicon oxide film 90 has a composition that is deficient in oxygen relative to the stoichiometric composition. Accordingly, little oxygen is supplied from the silicon oxide film 90 to the piezoelectric thin film 10 during heat treatment of the piezoelectric device 101, for example, when the piezoelectric device 101 is mounted on a module board. This prevents oxidation of the piezoelectric thin film 10 and therefore formation of an oxide layer 121 (see FIG. 2) with high resistivity in the piezoelectric thin film 10. As a result, as shown in FIG. 8, a pyroelectric charge generated in the piezoelectric thin film 10 flows to the silicon oxide film 90.

Thus, the piezoelectric device 101 and the method of manufacture thereof according to this preferred embodiment prevent oxidation of the extremely thin piezoelectric thin film 10 and prevent damage to the electrodes 60A to 60C formed on the piezoelectric thin film 10 caused by pyroelectric charge.

The piezoelectric thin film 10, which is preferably formed of lithium tantalate, has pyroelectricity and high insulation properties. Thus, the piezoelectric device 101 and the method of manufacture thereof according to this preferred embodiment are suitable when the piezoelectric thin film 10 is formed using such a material.

In the piezoelectric device 101 according to this preferred embodiment, the piezoelectric thin film 10, which is formed by an ion implantation step, particularly easily absorbs oxygen because strain remains in the crystal lattice after ion implantation. Thus, the piezoelectric device 101 and the method of manufacture thereof according to this preferred embodiment are suitable when the piezoelectric thin film 10 is formed by an ion implantation step.

In this preferred embodiment, a single-crystal thin film is preferably formed by ion implantation, bonding, and splitting, for example. Such a single-crystal thin film has a higher piezoelectricity than a polycrystalline thin film deposited by, for example, sputtering, evaporation, or CVD. In addition, the piezoelectric thin film 10 has the same crystal orientation as the single-crystal piezoelectric substrate 1. Accordingly, a single-crystal piezoelectric substrate 1 having a crystal orientation depending on the properties of the piezoelectric device 101 may be provided to form a piezoelectric thin film 10 having a crystal orientation depending on those properties.

The composition of the silicon oxide film 90 will now be described in detail.

TABLE 1

Silicon oxide film ($Si_xO_y$)

| Sample | Composition (y/x) | Resistivity of LT thin film before heat treatment (Ωcm) | Resistivity of LT thin film after heat treatment (Ωcm) | Resistivity of silicon oxide film (Ωcm) |
|---|---|---|---|---|
| Oxygen-rich | 2.02 | $10^{10}$ | $10^{15}$ | $10^{13}$ |
| Standard | 2.00 | | $10^{15}$ | $10^{13}$ |
| Oxygen-deficient 1 | 1.99 | | $10^{11}$ | $10^{13}$ |
| Oxygen-deficient 2 | 1.97 | | $10^{11}$ | $10^{13}$ |
| Oxygen-deficient 3 | 1.95 | | $10^{10}$ | $10^{12}$ |
| Oxygen-deficient 4 | 1.90 | | $10^{10}$ | $10^{12}$ |
| Oxygen-deficient 5 | 1.80 | | $10^{10}$ | $10^{12}$ |
| Oxygen-deficient 6 | 1.70 | | $10^{10}$ | $10^{9}$ |
| Oxygen-deficient 7 | 1.60 | | $10^{10}$ | $10^{6}$ |
| Oxygen-deficient 8 | 1.55 | | $10^{10}$ | $10^{4}$ |

Table 1 shows the results of an experiment in which ten samples of the piezoelectric device 101 having the structure shown in FIG. 7B were prepared with varying compositions of the silicon oxide film 90 and were heat-treated in a vacuum atmosphere at 500° C. for 30 minutes to measure the resistivity of the piezoelectric thin film 10 and the resistivity of the silicon oxide film 90 after the heat treatment.

To avoid problems such as damage to the lithium tantalate piezoelectric thin film 10 by pyroelectric charge, the piezoelectric thin film 10 preferably has a resistivity of about $10^{11}$ Ω·cm or less. Accordingly, as shown in Table 1, the silicon oxide film 90 preferably has a composition satisfying the relationship $y/x<2$ in $Si_xO_y$, for example.

At the same time, the dielectric film preferably has sufficient insulation properties. If the thickness of the dielectric film, i.e., the silicon oxide film 90, is about 0.1 to 10 μm, the resistivity of the silicon oxide film 90 is preferably about $10^6$ Ω·cm or more, which does not adversely affect the characteristics of surface acoustic wave devices. Accordingly, as shown in Table 1, the silicon oxide film 90 preferably has a composition satisfying the relationship $1.6 \leq y/x$, for example.

Thus, if the thickness of the silicon oxide film 90 is about 0.1 μm to about 10 μm, for example, a silicon oxide film 90 having a composition satisfying the relationship $1.6 \leq y/x < 2$ is preferably deposited in the step at S102 for use with surface acoustic wave devices.

Although the dielectric film 90 in the above preferred embodiment preferably is a silicon oxide film, the dielectric film 90 may in practice be formed of other oxides such as aluminum oxide, tantalum oxide, and zinc oxide, for example. Such oxide films provide the same advantages as in the above preferred embodiment if they have a composition that is deficient in oxygen relative to the stoichiometric composition. The following compositions inhibit oxidation of the piezoelectric thin film 10 and also allow the resistivity of the oxide film itself to be set to a level that does not adversely affect the characteristics of piezoelectric devices:

for an aluminum oxide film, a composition satisfying $1 \leq y/x < 1.5$ in $Al_xO_y$;

for a tantalum oxide film, a composition satisfying $2 \leq y/x < 2.5$ in $Ta_xO_y$; and for a zinc oxide film, a composition satisfying $0.6 \leq y/x < 1$ in $Zn_xO_y$.

Although the above preferred embodiments illustrate surface acoustic wave devices, the method of manufacture according to the present invention is also applicable to various other devices based on a single-crystal piezoelectric thin film and having a membrane, including boundary acoustic wave devices, bulk wave devices, gyroscopes, RF switches, and vibration-type energy generators.

The description of the above preferred embodiments is illustrative in all aspects and should not be construed as limiting. The scope of the present invention is defined by the claims, rather than by the above preferred embodiments. All modifications within the meaning and range of equivalents of the claims are intended to be included within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a piezoelectric device, comprising:

an oxide-film forming step of forming on a support an oxide film having a composition that satisfies a condition of having less oxygen than a stoichiometric composition; and a piezoelectric-thin-film forming step of forming a piezoelectric thin film on a surface of the oxide film opposite to a surface thereof closer to the support; wherein the piezoelectric-thin-film forming step includes:

an ion implantation step of implanting an ionized element into a piezoelectric substrate to form a region in which the concentration of the ionized element implanted into the piezoelectric substrate peaks; and a splitting step of splitting the piezoelectric substrate along the region in which the concentration of the implanted element peaks to form the piezoelectric thin film on the oxide film.

2. The method for manufacturing a piezoelectric device according to claim 1, wherein the oxide film is a silicon oxide film; and the composition of the oxide film satisfies a relationship $1.6 \leq y/x < 2$ in $Si_xO_y$.

3. The method for manufacturing a piezoelectric device according to claim 2, wherein the piezoelectric thin film includes single-crystal lithium niobate or single-crystal lithium tantalate.

4. The method for manufacturing a piezoelectric device according to claim 2, wherein:
   a thickness of the silicon oxide film is about 0.1 μm to about 10 μm; and
   a resistivity of the silicon oxide film is about $10^6$ Ω·cm or more.

5. The method for manufacturing a piezoelectric device according to claim 4, further comprising:
   a dielectric film forming step of forming a dielectric film between the support and the silicon oxide film.

6. The method for manufacturing a piezoelectric device according to claim 4, wherein the piezoelectric thin film includes single-crystal lithium niobate or single-crystal lithium tantalate.

7. The method for manufacturing a piezoelectric device according to claim 1, wherein the piezoelectric thin film includes single-crystal lithium niobate or single-crystal lithium tantalate.

8. The method for manufacturing a piezoelectric device according to claim 1, wherein the piezoelectric thin film includes single-crystal lithium niobate or single-crystal lithium tantalate.

9. The method for manufacturing a piezoelectric device according to claim 1, further comprising:
   an IDT electrode forming step of forming an IDT electrode on the piezoelectric thin film.

* * * * *